(12) United States Patent
Maroni et al.

(10) Patent No.: US 10,794,863 B1
(45) Date of Patent: Oct. 6, 2020

(54) IONIZER MONITORING SYSTEM AND ION SENSOR

(71) Applicant: NRD LLC, Grand Island, NY (US)

(72) Inventors: Timothy Maroni, Grand Island, NY (US); Jeremy Paul Willden, Pleasant Grove, UT (US); Martin Robert Johnson, Draper, UT (US); Helaman David Pratt Ferguson, Orem, UT (US); John Patrick Filoso, Pleasant Grove, UT (US); Jonathan Scott Jensen, Pocatello, ID (US); Victor Habinshuti, Williamsville, NY (US); Derek Brim, Buffalo, NY (US); Spencer Ralph Dodge, Sammamish, WA (US); Robert Edmund Gooch, Orem, UT (US); Gary Burridge, Grand Island, NY (US); John M. Glynn, II, Burlington, MA (US)

(73) Assignee: NRD LLC, Grand Island, NY (US)

( * ) Notice: Subject to any disclaimer, the term of this patent is extended or adjusted under 35 U.S.C. 154(b) by 345 days.

(21) Appl. No.: 15/954,041

(22) Filed: Apr. 16, 2018

(51) Int. Cl.
| G01N 27/70 | (2006.01) |
| H05K 1/18 | (2006.01) |
| H05K 1/14 | (2006.01) |
| H05F 3/06 | (2006.01) |
| H05K 5/00 | (2006.01) |

(52) U.S. Cl.
CPC ............... *G01N 27/70* (2013.01); *H05F 3/06* (2013.01); *H05K 1/14* (2013.01); *H05K 1/181* (2013.01); *H05K 5/0026* (2013.01); *H05K 2201/10151* (2013.01)

(58) Field of Classification Search
CPC .......... G01N 27/62; G01N 27/70; H05F 3/06; H05K 1/14; H05K 1/181; H05K 5/0026; H05K 2201/10151; H05K 1/141
See application file for complete search history.

(56) References Cited

U.S. PATENT DOCUMENTS

| 4,477,263 | A | 10/1984 | Shaver et al. |
| 4,542,434 | A | 9/1985 | Gehlke et al. |
| 4,809,127 | A | 2/1989 | Steinman et al. |
| 4,901,194 | A * | 2/1990 | Steinman ................ H01T 23/00 |
| | | | 250/423 R |
| 4,951,172 | A | 8/1990 | Steinman et al. |
| 4,974,115 | A | 11/1990 | Breidegam et al. |
| 5,047,892 | A * | 9/1991 | Sakata .................... H01T 23/00 |
| | | | 361/216 |
| 6,052,053 | A | 4/2000 | Jubin et al. |
| 6,078,875 | A | 6/2000 | Jubin et al. |
| 6,252,233 | B1 | 6/2001 | Good |
| 6,781,811 | B2 | 8/2004 | Posadas |

(Continued)

FOREIGN PATENT DOCUMENTS

CN        201668763        12/2010

*Primary Examiner* — Adolf D Berhane
(74) *Attorney, Agent, or Firm* — Simpson & Simpson, PLLC; Michael Nicholas Vranjes (57) ABSTRACT

A sensor for sensing ions, including a circuit board assembly, a core, a cage at least partially surrounding the core, a first wire wrapped around the core and connected to the circuit board assembly, a second wire wrapped around the core and connected to the circuit board assembly, and a third wire connecting the cage to the circuit board assembly.

12 Claims, 9 Drawing Sheets

(56) References Cited

U.S. PATENT DOCUMENTS

| | | | |
|---|---|---|---|
| 6,785,114 B2* | 8/2004 | Gorczyca | B03C 3/155 361/213 |
| 7,924,544 B2 | 4/2011 | Richie et al. | |
| 8,861,166 B2 | 10/2014 | Richie, Jr. et al. | |
| 9,404,945 B2 | 8/2016 | Savich | |
| 2003/0218855 A1* | 11/2003 | Goldenberg | H01T 23/00 361/213 |
| 2004/0145852 A1* | 7/2004 | Kraz | H01T 23/00 361/225 |
| 2005/0031503 A1 | 2/2005 | Fox et al. | |
| 2005/0063130 A1* | 3/2005 | Francis | H01T 23/00 361/220 |
| 2006/0002051 A1* | 1/2006 | Goudy, Jr. | C01B 13/11 361/220 |
| 2009/0053989 A1 | 2/2009 | Lunde et al. | |
| 2011/0032496 A1* | 2/2011 | Shibazaki | G03F 7/70133 355/30 |
| 2011/0274228 A1* | 11/2011 | Lopez | G21B 3/00 376/146 |
| 2013/0271164 A1* | 10/2013 | Savich | H01T 23/00 324/679 |
| 2015/0336109 A1* | 11/2015 | Gefter | H05F 3/06 95/2 |

* cited by examiner

IONIZER MONITORING SYSTEM AND ION SENSOR

FIELD

The present disclosure relates to an ionizer system, and, more particularly, to an ionizer system having a controller that monitors and regulates the ions in the air using a sensor and at least one ionizer.

BACKGROUND

Air ionizers are often used in places where work is done involving static-electricity-sensitive electronic components, to eliminate the build-up of static charges on non-conductors as well as static cling. As those elements are very sensitive to electricity, they cannot be grounded because the discharge will destroy them as well. Usually, the work is done over a special dissipative table mat, which allows a very slow discharge, and under the air gush of an ionizer. For example, clean rooms having expensive and sensitive machines therein often require ionizers to neutralize static charge therein. In another example, ionizers may be used in environments containing explosive gases or powders.

Historically, effectiveness of anti-static ionizers has been verified by the use of a charged plate monitor (CPM). The monitor consists of a metal plate exposed to the air, which is charged to a substantial voltage (typically on the order of +1000V or −1000V). A non-contact, or other very high impedance, voltmeter measures the voltage on the plate as it discharges. The ions of opposite charge in the air are attracted to the charged plate, and when they come in contact with the plate, the charge is neutralized. The discharge time of the plate is used as a measurement of the effectiveness of the ionization system. Some of the disadvantages of this system include: lack of continuous monitoring; potential safety hazards of the exposed high-voltage plate; the depletion of the ions near the charged plate, thereby reducing the effectiveness of the ionization protection when a test is in process; and, relatively large plate area. Additionally, CPMs typically can only sense positive ions or negative ions, not both, at a time. Or, two separate CPMs would be utilized, one detecting positive ions and the other detecting negative ions, each requiring its own power source.

Thus, there has been a long-felt need for a sensor that overcomes the limitations of traditional CPMs by performing continuous measurement of the ion current, rather than making an indirect measurement on the voltage of a plate as it discharges due to the ion current. Additionally, there has been a long-felt need for an ionization monitoring system that communicates with the sensor and one or more ionizers, to automatically adjust ion production to maintain ion balance in the air.

SUMMARY

According to aspects illustrated herein, there is provided a sensor for sensing ions, comprising a circuit board assembly, a core, a cage at least partially surrounding the core, a first wire wrapped around the core and connected to the circuit board assembly, a second wire wrapped around the core and connected to the circuit board assembly, and a third wire connecting the cage to the circuit board assembly.

According to aspects illustrated herein, there is provided an ionizer system, comprising a controller, at least one sensor connected to the controller, the at least one sensor including a first circuit board assembly, a core, a cage at least partially surrounding the core, a first wire wrapped around the core and connected to the first circuit board assembly, a second wire wrapped around the core and connected to the first circuit board assembly, and a third wire connecting the cage to the first circuit board assembly, and at least one ionizer connected to the controller.

According to aspects illustrated herein, there is provided a method of monitoring an ionizing system, the method comprising receiving a first set of data from at least one sensor of an ion imbalance, making a first determination, based on the first set of data, whether positive ions or negative ions are needed, sending a first signal, based on the first determination, to at least one ionizer to produce the positive ions or negative ions, sending a first communication about the first determination and the first signal to a remote computing device, receiving a second set of data from the at least one sensor of an ion balance, making a second determination, based on the second set of data, that no positive ions or negative ions are needed, sending a second signal, based on the second determination, to the at least one ionizer to stop producing positive and negative ions, and sending a second communication about the second determination and the second signal to the remote computing device.

The sensor of the instant invention overcomes the limitations of traditional CPMs by performing continuous measurement of the ion current, rather than making an indirect measurement on the voltage of a plate as it discharges due to the ion current. The measurement of current is enabled by a very low-leakage, high-impedance amplifier, configured as a "transimpedance amplifier." This configuration converts current to voltage and is often used to detect small currents in photodiodes, such as those detecting optical data at the end of a long fiber-optic cable. This configuration enables measurements on the order of picoamps, an extremely low current level. For comparison, one Amp of current is equivalent to $6.25 \times 10^{18}$ electrons per second, similar to the amount of current required to charge a cell phone. One picoamp is only 6,250,000 electrons per second, and a measurement of one picoamp of current represents approximately 6 million ions colliding with the sensor element per second.

In one embodiment, the sensor itself is composed of two interleaved wire helices wrapped around a common core element, surrounded by a metal (conductive) shield with openings to allow airflow. The shield protects the sensor helices from electric fields which would otherwise affect the measurements and thus the readings. The conductive metal shield is connected to the electrical ground plane of the sensor circuit boards. The circuit boards are also enclosed with conductive metal shielding to prevent interference, essentially forming a Faraday cage around the sensitive circuitry. In an example embodiment, the common core element comprises parallel stripes along the length thereof with adjacent stripes having alternating polarity.

The two helices are charged to voltages of approximately +35V and −35V, respectively, though the precise voltage may be adjusted for various reasons, including adjusting sensitivity, calibration, or to accommodate specific requirements of the customer. The helix with a positive charge, when impacted by negative ions, gains electrons, and the transimpedance amplifier converts this ion current into a voltage. Similarly, the negatively charged helix, when impacted by positive ions, loses electrons, and the transimpedance amplifier converts this current to a voltage as well. These voltages are filtered, amplified, conditioned, and ultimately digitized by an Analog to Digital Converter (ADC). The resulting digitized values are processed through proprietary algorithms to produce a result equivalent to the discharge time measured by a CPM. The measurements are also processed through a different proprietary algorithm to determine the Direct Current (DC) balance of the ionizing system. If an uncharged CPM is placed in an ionizing stream, ideally, the plate would remain at zero volts with respect to ground, but many ionizers produce a slight imbalance in their ion streams, resulting in the CPM receiving a small positive or negative charge. The sensor of the instant invention can also measure this DC offset, essentially by comparing the results of the positive and negative helix currents.

The digitized data sets are converted to a serial message format and transmitted via RS-485 (or another communication physical layer) to a controller. The level of ionization and the DC balance will be used to send control messages from the controller to an ionizer, adjusting it to ensure optimal protection against electrical charge buildup. The controller stores some data short-term and feeds the information via a network protocol (e.g., via Wi-Fi, Ethernet, or any other suitable method) to a data aggregator, which handles long-term storage of the measurements (e.g., computing device). A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

The controller provides for automatic, real-time adjustment of ionizer DC balance, data logging of measured ionizer performance, and a remote, distributed system allowing for a Wi-Fi/Wireless/Wired network, local control, central data aggregation, cloud connectivity, user notification/email/paging/display, Web Interface, and mobile app access and control. The controller further provides an extensible system to allow addition of new sensors, indicators, ionizers, and other components in the future.

These and other objects, features, and advantages of the present disclosure will become readily apparent upon a review of the following detailed description of the disclosure, in view of the drawings and appended claims.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements. It is to be understood that the claims are not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the claims.

Unless defined otherwise, all technical and scientific terms used herein have the same meaning as commonly understood to one of ordinary skill in the art to which this disclosure pertains. It should be understood that any methods, devices or materials similar or equivalent to those described herein can be used in the practice or testing of the example embodiments.

It should be appreciated that the term "substantially" is synonymous with terms such as "nearly," "very nearly," "about," "approximately," "around," "bordering on," "close to," "essentially," "in the neighborhood of," "in the vicinity of," etc., and such terms may be used interchangeably as appearing in the specification and claims. It should be appreciated that the term "proximate" is synonymous with terms such as "nearby," "close," "adjacent," "neighboring," "immediate," "adjoining," etc., and such terms may be used interchangeably as appearing in the specification and claims. The term "approximately" is intended to mean values within ten percent of the specified value.

Figure 1:
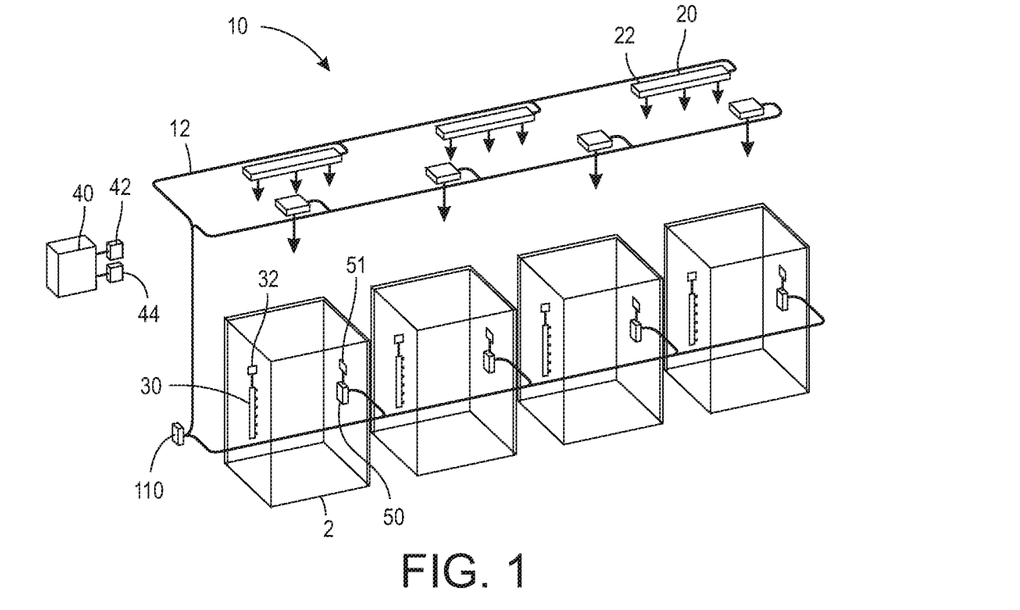
FIG. 1 is a front perspective view of an ionizer system.

Adverting now to the figures, FIG. 1 is a front perspective view of ionizer system 10. Ionizer system generally comprises sensor 50, controller 110, and at least one ionizer. In an example embodiment, ionizer system comprises whole room ionizer 20, individual ionizer 30, sensor 50, and controller 110. Whole room ionizer 20, individual ionizer 30, and sensor 50 are connected to controller 110 via electrical conduit 12. whole room ionizer 20, individual ionizer 30, and sensor 50 are also provided power through electrical conduit 12. However, it should be appreciated that whole room ionizer 20, individual ionizer 30, and sensor 50 may be connected to controller 110 via wireless communication, for example, Wi-Fi, Bluetooth technology, ZigBee, Infrared (IR), Radio, or any other suitable wireless communication method. In a wireless embodiment, whole room ionizer 20, individual ionizer 30, and sensor 50 would each have a suitable power source, for example, AC mains or battery. Controller 110 is capable of wirelessly communicating with remote computing device 40. Computing device 40 includes receiver 42 for receiving information from controller 110 and transmitter 44 for sending information to controller 110. Computing device 40 may also have a digital user interface.

Whole room ionizer 20 is a device that uses high voltage to ionize (electrically charge) air molecules. Whole room ionizer 20 is capable of generating negative ions, or anions, which are particles with one or more extra electron, conferring a net negative charge to the particle. Whole room ionizer 20 is also capable of generating positive ions, or cations, which are ions missing one or more electrons, resulting in a net positive charge. Whole room ionizer 20 may comprise a fan physically built therein. As ions are generated, the fan distributes the ions throughout the room or space. Whole room ionizer 20 is connected to controller 110 via electrical conduit 12. Whole room ionizer 20 is generally in communication with sensor 50. Specifically, whole room ionizer 20 receives instructions from controller 110 to distribute more negative ions and/or positive ions throughout the space or room. In an example embodiment, whole room ionizer 20 comprises receiver 22 and receives instructions from controller 110 via wireless transmission, without the need for physical electrical connection therebetween. It should be appreciated that ionizer system 10 may have any number of whole room ionizers to provide suitable ionization for the environment. For example, ionizer system 10 may have one or more whole room ionizers arranged thereon.

Individual ionizer 30 is a device that uses high voltage to ionize (electrically charge) air molecules. Individual ionizer 30 is capable of generating negative ions, or anions, which are particles with one or more extra electron, conferring a net negative charge to the particle. Individual ionizer 30 is also capable of generating positive ions, or cations, which are ions missing one or more electrons, resulting in a net positive charge. Individual ionizer 30 is preferably arranged on, or close in proximity to, machine 2. Individual ionizer 30 provides a higher concentration of ions directly around machine 2, whereas whole room ionizer 20 distributes ions generally to the entire space or room. Individual ionizer 30 may use compressed air to distribute ions, rather than a fan as in whole room ionizer 20. For example, as ions are generated, the compressed air distributes the ions directly around machine 2. In an example embodiment, individual ionizer 30 is connected to a compressor, which provides the compressed air. It should be appreciated that individual ionizer 30 may use a fan to distribute ions, and that whole room ionizer 20 may use compressed air to distribute ions. Individual ionizer 30 is connected to controller 110 via electrical conduit 12. Individual ionizer 30 is generally in communication with sensor 50. Specifically, individual ionizer 30 receives instructions from controller 110 to distribute more negative ions and/or positive ions throughout to and around machine 2. In an example embodiment, individual ionizer 30 comprises receiver 32 and receives instructions from controller 110 via wireless transmission, without the need for physical electrical connection therebetween. It should be appreciated that ionizer system 10 may have any number of individual ionizers to provide suitable ionization for the environment. For example, every machine may have one or more individual ionizers arranged thereon.

Figure 2:
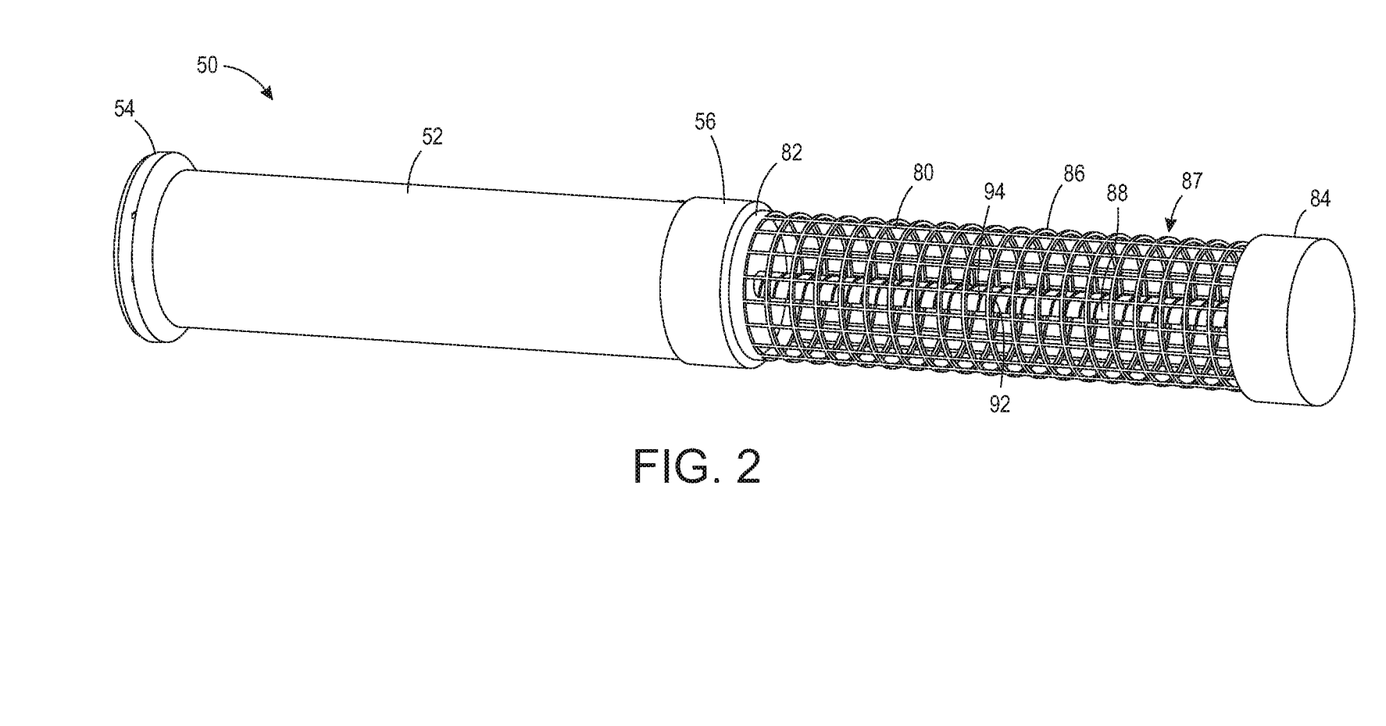
FIG. 2 is a top perspective view of a sensor, as shown in FIG. 1.
Figure 3:
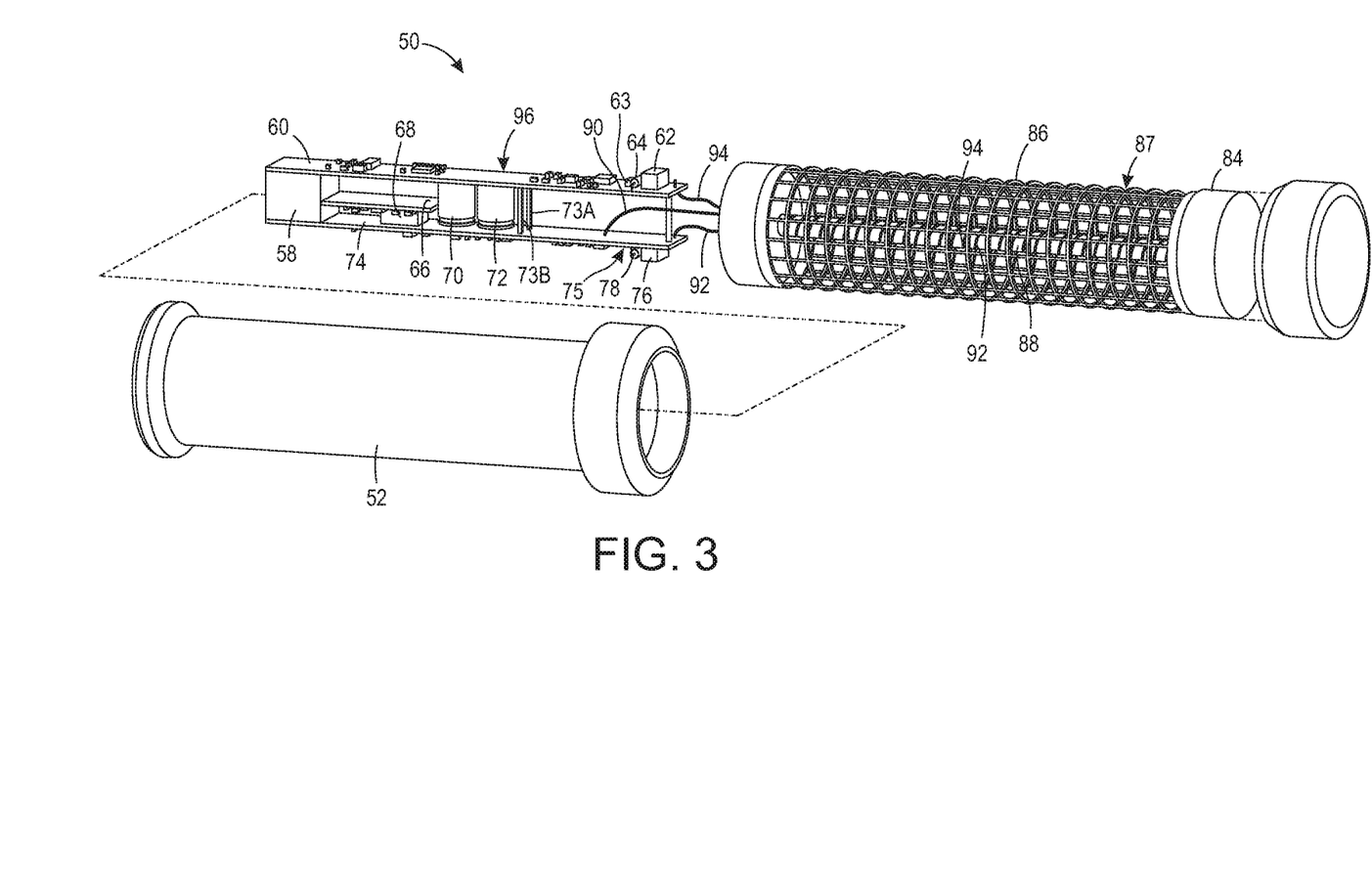
FIG. 3 is an exploded view of the sensor shown in FIG. 2.
Figure 4:
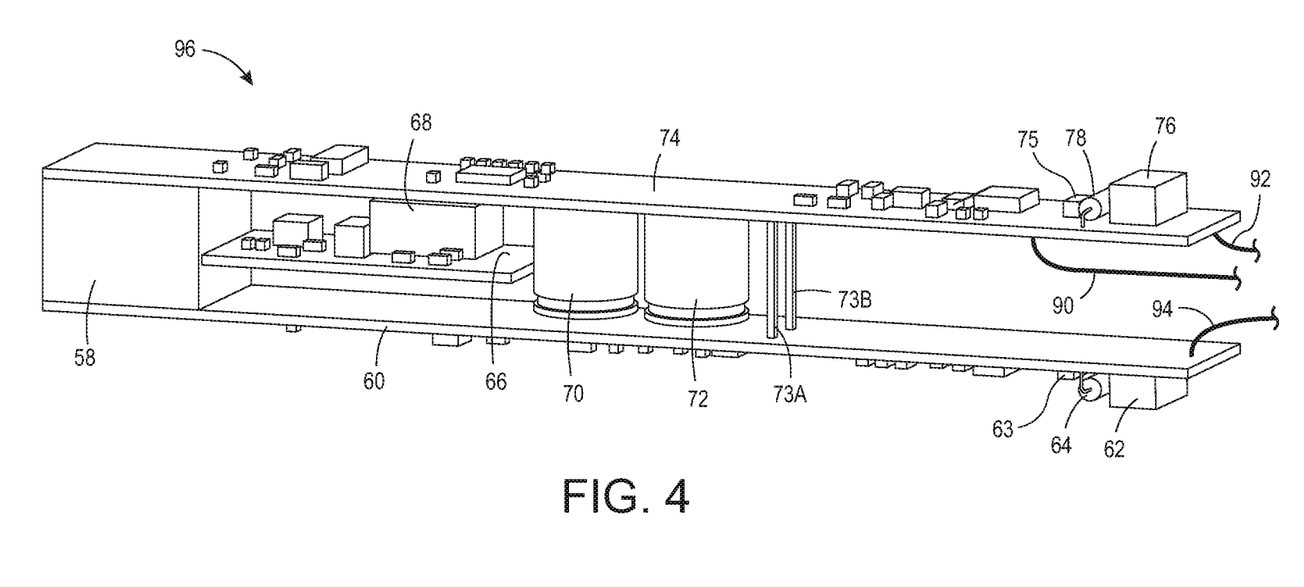
FIG. 4 is a perspective view of a circuit board assembly as shown in FIG. 3.

FIG. 2 is a top perspective view of sensor 50. FIG. 3 is an exploded view of sensor 50. FIG. 4 is a perspective view of circuit board assembly 96. Sensor 50 generally comprises housing 52, ion sensor 80, and circuit board assembly 96. Sensor 50 compares positive and negative ions in the space or room and sends that information to controller 110. The following description should be read in view of FIGS. 2-4.

Housing 52 is generally cylindrical and comprises end 54 and end 56. Housing 52 is preferably a conductive metal shielding that at least partially forms a Faraday shield around circuit board assembly 96, which is housed therein. A Faraday shield or Faraday cage (as discussed below) is an enclosure used to block electromagnetic fields. A Faraday shield may be formed by a continuous covering of conductive material or in the case of a Faraday cage, by a mesh of such materials. As such, housing 52 prevents interference with the sensitive circuitry of circuit board assembly 96. In an example embodiment, housing 52 comprises stainless steel. In an example embodiment, housing 52 comprises a plastic shell that is internally coated with a metal. End 54 comprises port 58. Sensor 50 is connected to controller 110 through port 58 via electrical conduit 12. In an example embodiment, port 58 is a RJ 45 connector. However, it should be appreciated that port 58 may comprise any connector suitable for providing an interface between sensor 50 and controller 110. In an example embodiment, sensor 50 communicates with controller 110 via transmitter 51.

Ion sensor 80 extends from housing 52. Ion sensor 80 comprises cage 86 and core 88, both extending between end 82, connected to end 56, and end 84. Ends 82 and 84 may comprise a conductive material, or may comprise plastic or other non-conductive material coated or wrapped in a conductive material such as copper foil. The material of ends 82 and 84 is such that it aids in creating a Faraday cage as discussed further below. Core 88 is a nonconductive core including two interleaved wire helices wrapped therearound. As shown in the figures, wires 92 and 94 are alternatingly wrapped around core 88, which are connected to circuit board assembly 96. Specifically, wire 92 is connected to circuit board 74 via any suitable method, for example, soldering. Wire 94 is connected to circuit board 60 via any suitable method, for example, soldering. One of wires 92 and 94 is charged to a voltage of approximately +35V and the other of wires 92 and 94 is charged to a voltage of approximately −35V. However, it should be appreciated that the precise voltage may be adjusted for various reasons, including adjusting sensitivity, calibration, or to accommodate specific requirements of the user. In an example embodiment, wire 92 comprises a positive charge and, when impacted by negative ions, gains electrons. Wire 92 is connected to circuit board 74 which comprises a transimpedance amplifier that converts this ion current into a voltage. Similarly, wire 94 comprises a negative charge and, when impacted by positive ions, loses electrons. Wire 94 is connected to circuit board 60 which comprises a transimpedance amplifier that converts this current to a voltage. It should be appreciated that in an example embodiment, wire 92 may comprise a negative charge and wire 94 may comprise a positive charge. These voltages are filtered, amplified, conditioned, and ultimately digitized by an ADC. The resulting digitized values are processed through proprietary algorithms to produce a result equivalent to the discharge time measured by a CPM. The measurements are also processed through a different proprietary algorithm to determine the DC balance of the ionizing system. If an uncharged CPM is placed in an ionizing stream, ideally, the plate would remain at zero volts with respect to ground, but many ionizers produce a slight imbalance in their ion streams, resulting in the charged plate monitor receiving a small positive or negative charge. This sensor technology can also measure this DC offset, essentially by comparing the results of the positive and negative helix currents. In an example embodiment, wires 92 and 94 are uninsulated, low corrosion, gold plated wires. The double-helix sensor design functions to provide real-time, direct measurement of ion current, and low noise/leakage.

Cage 86 is a metal (conductive) shield having openings 87 to allow airflow to core 88. Cage 86 forms a Faraday cage which protects wires 92 and 94 from electric fields that would otherwise affect the readings. Cage 86 is connected to the electrical ground plane of the sensor circuit boards, for example, an electrical ground plane (not shown) within circuit board 74, via wire 90. It should be appreciated that, cage 86 may be connected to an electrical ground plane located on circuit board 60 via wire 90. Furthermore, the electrical ground plane in circuit board 74 and the electrical ground plane in circuit board 60 are connected via one or more conductive pins, shown as pins 73A and 73B. Pins 73A and 73B extend from circuit board 60 to circuit board 74 to electrically connect the ground planes arranged in circuit board 60 and circuit board 74. The ground planes in circuit boards 60 and 74 help reduce the influence of external noise sources from interrupting the circuitry of circuit board assembly 96. The ground planes of the circuit boards keep sensitive analog circuits operating at low noise capability. It should be appreciated that any number of pins suitable for connecting the ground planes to reduce the external noise affecting the circuitry may be used. In an example embodiment, cage 86 is arranged as a mesh shield that attenuates external electromagnetic waves before they reach the double helix formed by wires 92 and 94, yet allows ions to flow therethrough. Openings 87 may comprise a square, hexagonal, circular, or irregular polygon geometry, or any other suitable geometry.

Circuit board assembly 96 generally comprises circuit board 60, circuit board 74, and circuit board 66, which are all connected to port 58. Circuit boards 60, 74, and 66 may be printed circuit boards (PCBs). Power inductor 68 is arranged between circuit board 66 and circuit board 74. However, power inductor 68 may be arranged at any suitable location relative to circuit boards 66 and 74. Circuit board 66 and power inductor 68 are arranged to regulate the power supplied to sensor 50. Circuit board 60 comprises inter alia, control relay 62, gain-control resistor 64, filter capacitor 63, and a transimpedance amplifier, and is connected to wire 94. Circuit board 60 is arranged to convert current in wire 94 to a voltage, and subsequently filter, amplify, condition, and digitize that voltage. Similarly, circuit board 74 comprises inter alia, control relay 76, gain-control resistor 78, filter capacitor 75, and a transimpedance amplifier, and is connected to wire 92. Circuit board 74 is arranged to convert current in wire 92 to a voltage, and subsequently filter, amplify, condition, and digitize that voltage. The digitized sets of data created by circuit boards 60 and/or 74 are then converted to a serial message format and transmitted via RS-485 (or another communication means) to controller 110. The level of DC balance determined by sensor 50 will be used by controller 110 to send information to an ionizer, adjusting it to ensure optimal protection against electrical charge buildup, as will be discussed in greater detail below.

Figure 5:
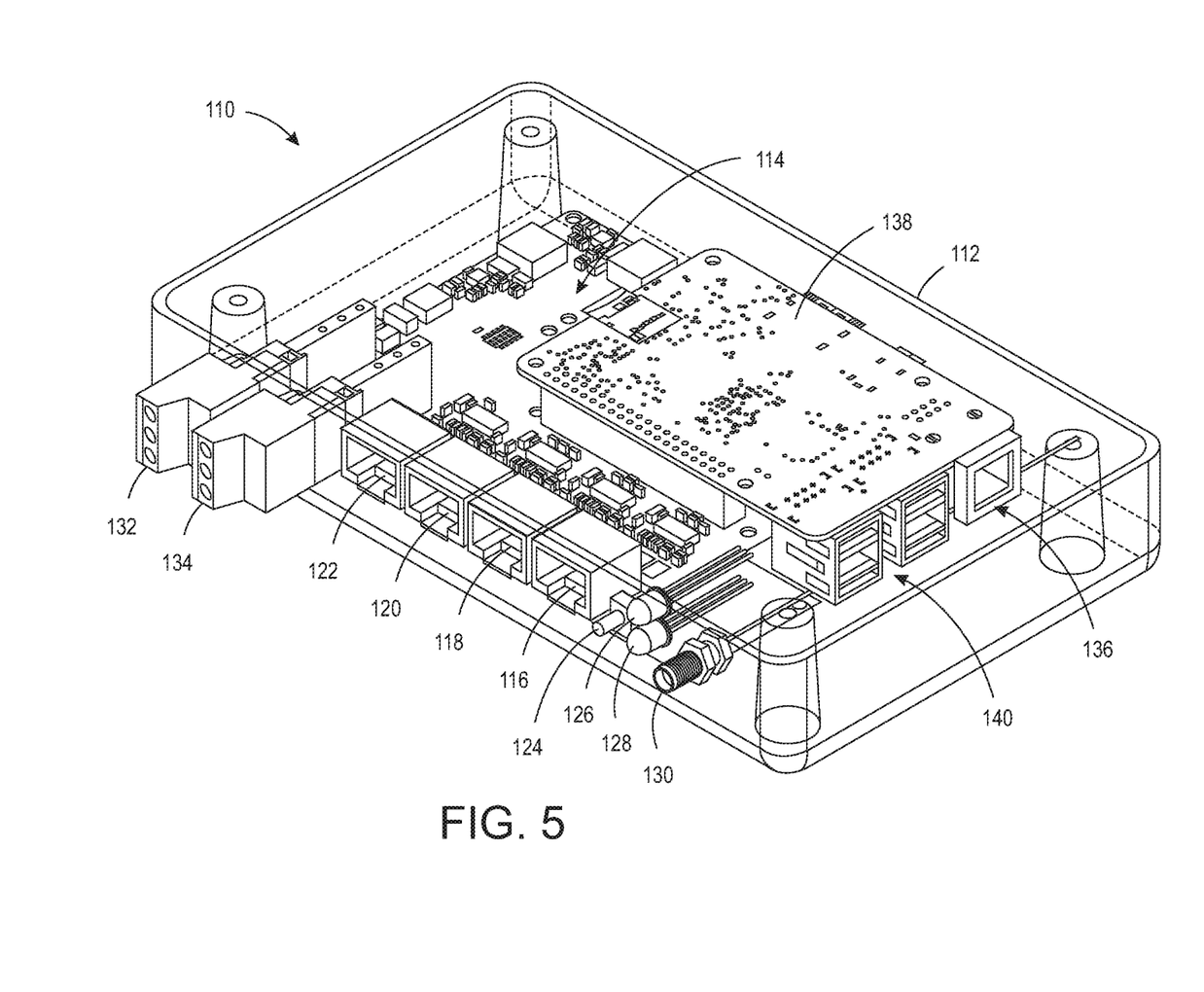
FIG. 5 is a perspective view of a controller, as shown in FIG. 1.
Figure 6:
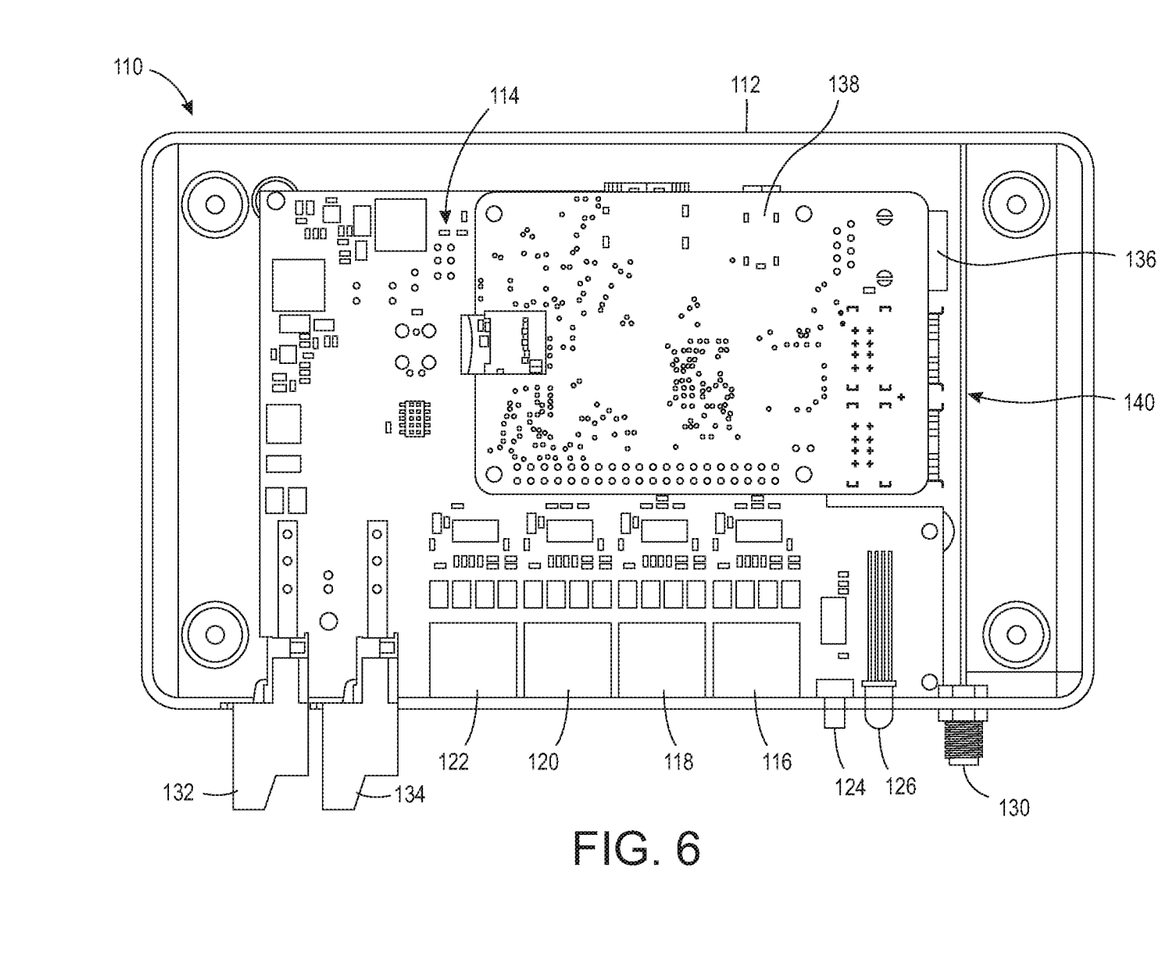
FIG. 6 is a top elevational view of the controller shown in FIG. 5.
Figure 7:
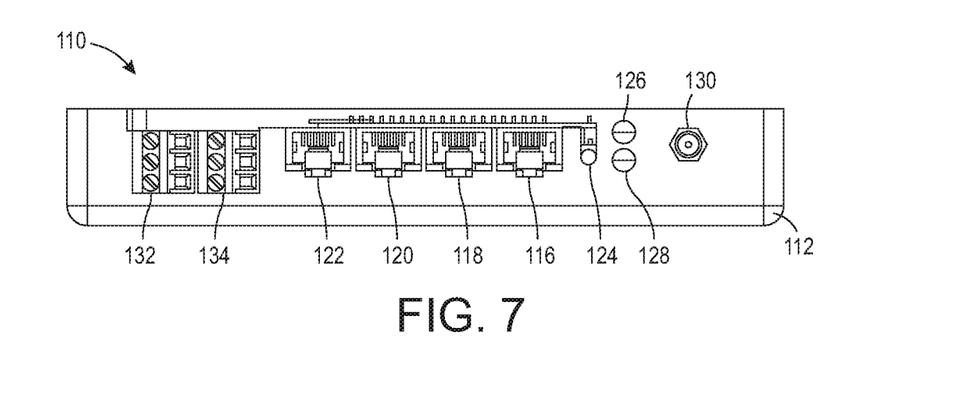
FIG. 7 is a front elevational view of the controller shown in FIG. 5.
Figure 8:
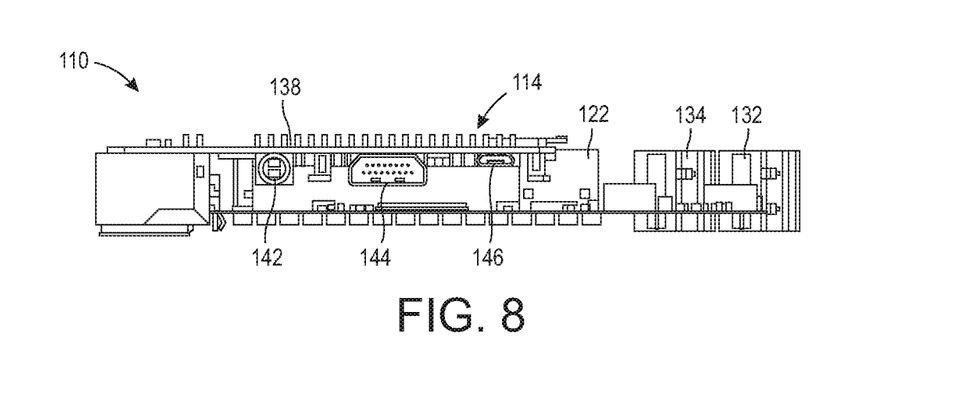
FIG. 8 is a rear elevational view of the controller shown in FIG. 5.

FIG. 5 is a perspective view of controller 110, with a top portion of housing 112 removed for viewing purposes. FIG. 6 is a top elevational view of controller 110. FIG. 7 is a front elevational view of controller 110. FIG. 8 is a rear elevational view of controller 110 with housing 112 completely removed for viewing purposes. The following description should be read in view of FIGS. 5-8.

Controller 110 generally comprises housing 112 which protectively encloses circuit board 114 and data aggregator 138. Housing 112 comprises bottom portion 112A and top portion 112B (not shown). In an example embodiment, data aggregator 138 comprises a central processing unit (CPU).

Circuit board 114 comprises event detector port 116, ionizer port 118, sensor port 120, optional port 122, mode button 124, indicator lights 126 and 128, antenna port 130, power port 132, and optional communication or trigger port 134. Controller 110 is supplied power via power port 132. Mode button 124 allows a user to interact with controller 110. It should be appreciated that ports 116, 118, 120, and 122 are equivalent and interchangeable, and they also provide power to the peripherals. The peripherals announce to controller 110 what they are when they are plugged in. For example, if sensor 50 is plugged into port 118, the peripheral tells controller 110 to turn port 118 into a sensor port. The same detection means are included into each of the ports. It should be appreciated that controller 110 may have any suitable number of ports, and the instant invention is not limited to the number of ports illustrated in the figures.

Event detector port 116 is arranged to send a signal or signals to a remote location indicating that ionizer system 10 is not operating normally. If an error has occurred with controller 110, sensor 50, whole room ionizer 20, or individual ionizer 30, controller 110 sends a signal to indicate such (e.g., if an ionizer or sensor has been damaged). Controller 110 may also send a signal via event detector port 116 to a remote location to indicate the ionizer system 10 is operating normally. Similarly, indicator lights 126 and 128 are arranged for a visual indication of system status. In an example embodiment, indicator light 126 is red and indicator light 128 is green. When ionizer system 10 is operating normally, indicator light 128 is on and indicator light 126 is off. When an error has occurred in ionizer system 10, as discussed above, indicator light 126 is on and indicator light 128 is off. Indicator lights 126 and 128 are preferably light emitting diodes (LEDs); however, it should be appreciated that indicator lights 126 and 128 may be any other suitable light source and any colors suitable for indicating the status of ionizer system 10. In an example embodiment, indicator lights 126 and 128 are red/green/blue LEDs and can indicate any color of the visible spectrum. In an example embodiment, controller 110 comprises a speaker and indicates that an error has occurred in ionizing system 10 via an alarm or other suitable noise (e.g., a siren). In an example embodiment, the colors indicated by indicator lights 126 and 128 could change back and for the depending on ion balance. In an example embodiment, the colors indicated by indicator lights 126 and 128 could show ion strength in a thermometer-style display.

Ionizer port 118 is arranged to physically connect one or more ionizers to controller 110. For example, whole room ionizer 20 and/or individual ionizer 30 are connected to controller 110 via ionizer port 118. It should be appreciated that controller 110 may have one or more ionizer ports, and that the embodiment shown is not limited to only one ionizer port. In an example embodiment, controller 110 comprises a separate ionizer port for each ionizer in ionizer system 10. Controller 110 may control all of the ionizers in ionizer system 10 together. For example, if controller 110 receives a signal from sensor 50 that ionizer system 10 needs more positive ions, controller 110 sends a signal to all of the ionizers to produce more positive ions. Controller 110 may control each of the ionizers in ionizer system 10 separately. For example, if controller 110 receives a signal from sensor 50 that machine 2 needs more positive ions, controller 110 sends a signal to only the individual ionizer 30, and not to whole room ionizer 20, to produce more positive ions.

Sensor port 120 is arranged to physically connect one or more sensors to controller 110. For example, sensor 50 is connected to controller 110 via sensor port 120. It should be appreciated that controller 110 may have one or more sensor ports, and that the embodiment shown is not limited to only one sensor port. In an example embodiment, controller 110 comprises a separate sensor port for each sensor in ionizer system 10. Controller 110 may receive information from all of the sensors in ionizer system 10 together. For example, if controller 110 receives a signal from one sensor that ionizer system 10 needs more positive ions, controller 110 sends a signal to all of the ionizers to produce more positive ions. Controller 110 may receive information from each of the sensors in ionizer system 10 individually and locationally. For example, if controller 110 receives a signal from sensor 50 that machine 2 needs more positive ions, controller 110 sends a signal to only the individual ionizer 30, and not to whole room ionizer 20, to produce more positive ions. In an example embodiment, sensor port 120 comprises a built in boot loader for programming controller 110, specifically circuit board 114.

Antenna port 130 is arranged to physically connect the transducer in controller 110 to an external transmitter or antenna, or an external transmitter having an antenna, either directly or through an extension cable. Specifically, antenna port 130 is arranged to connect to a transmission device or antenna, or a transmission device having an antenna, to transmit information wirelessly to receiver 42 of computing device 40. In an example embodiment, a transmission device may be built directly into controller 110 as will be discussed below. However, antenna port 130 allows for connection to a transmission device that is, for example, outside of the Faraday cage in which controller 110 is located.

Aggregator 138 comprises programming port 136, Universal Serial Bus (USB) ports 140, audio/composite video port 142, High-Definition Multimedia Interface (HDMI) port 144, and micro Universal Serial Bus (USB) port 146. Aggregator 138 is arranged a hardware device engineered to extract real-time intersection and traffic cabinet data from interconnected or non-interconnected intersections. In an example embodiment, aggregator 138 is a subassembly of controller 110 having a CPU and used as an optional controller.

Controller 110 stores some data short-term (i.e., via aggregator 138) and feeds the information via a network protocol (e.g., Wi-Fi, Ethernet, or any other suitable means) to computing device 40, which handles long-term storage of the measurements. A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

Controller 110 receives information from sensor 50, for example, that there is an imbalance in positive and negative ions. Controller 110 then sends a signal to whole room ionizer 20 and/or individual ionizer 30 to produce either positive or negative ions, whichever are needed. Sensor 50 then sends a signal to controller 110 when there is a balance in positive and negative ions. Controller 110 then sends a signal to whole room ionizer 20 and individual ionizer 30 to stop producing ions or maintain the present ratio. Controller 110 sends information to computing device 40 which is arranged to log data. For example, data may collected regarding the length of time the ionizers run in order to balance the ions in the space or room. If the ionizers need to run for 45 minutes while producing negative ions, but only need to run for 10 minutes while producing positive ions, this may be an indication that the ionizers are not producing negative ions as efficiently as they should be. Additionally or alternatively, this may be an indication that something in the space or room (e.g., a machine) is causing the significant imbalance of positive ions to negative ions, which is resulting in the need for significantly more negative ions. The real-time monitoring and data logging capabilities of ionizer system 10, specifically through the use of sensor 50, allows the efficiencies of the ionizers to be determined quickly and effectively, and allows deficiencies in machines or abnormalities in the environment to be detected.

Figure 9:
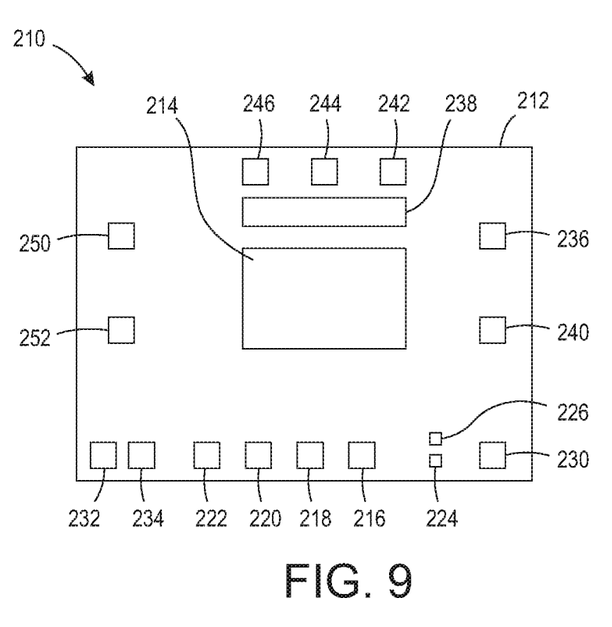
FIG. 9 is a schematic view of a controller.

FIG. 9 is a schematic view of controller 210. Controller 210 generally comprises housing 212 which protectively encloses circuit board 214, data aggregator 238, receiver 250, and transmitter 252. Housing 212 comprises bottom portion 212A and top portion 212B (not shown). Receiver 250 receives information wirelessly from a remote location, e.g., computing device 40. Receiver 250 allows controller 210 to be programmed wirelessly and remotely. Transmitter 252 allows controller 210 to send information wirelessly to a remote location, e.g., computing device 40. Transmitter 252 may be a replacement for, or additional component to, antenna port 230.

Circuit board 214 comprises event detector port 216, ionizer port 218, sensor port 220, optional port 222, mode button 224, indicator lights 226 and 228, antenna port 230, power port 232, and optional communication or trigger port 234. Controller 210 is supplied power via power port 232. Mode button 224 allows a user to interact with controller 210. It should be appreciated that the various ports are interchangeable and not dedicated to a specific location. Additionally, the various ports can be rededicated to provide for other uses.

Event detector port 216 is arranged to send a signal or signals to a remote location indicating that ionizer system 10 is not operating normally. If an error has occurred with controller 210, sensor 50, whole room ionizer 20, or individual ionizer 30, controller 210 sends a signal to indicate such (e.g., if an ionizer or sensor has been damaged). Controller 210 may also send a signal via event detector port 216 to a remote location to indicate the ionizer system 10 is operating normally. Similarly, indicator lights 226 and 228 are arranged for a visual indication of system status. In an example embodiment, indicator light 226 is red and indicator light 228. When ionizer system 10 is operating normally, indicator light 228 is on and indicator light 226 is off. When an error has occurred in ionizer system 10, as discussed above, indicator light 226 is on and indicator light 228 is off. Indicator lights 226 and 228 are preferably light emitting diodes (LEDs); however, it should be appreciated that indicator lights 226 and 228 may be any other suitable light source and any colors suitable for indicating the status of ionizer system 10. In an example embodiment, controller 210 comprises a speaker and indicates that an error has occurred in ionizing system 10 via an alarm or other suitable noise.

Ionizer port 218 is arranged to physically connect one or more ionizers to controller 210. For example, whole room ionizer 20 and/or individual ionizer 30 are connected to controller 210 via ionizer port 218. It should be appreciated that controller 210 may have one or more ionizer ports, and that the embodiment shown is not limited to only one ionizer port. In an example embodiment, controller 210 comprises a separate ionizer port for each ionizer in ionizer system 10. Controller 210 may control all of the ionizers in ionizer system 10 together. For example, if controller 210 receives a signal from sensor 50 that ionizer system 10 needs more positive ions, controller 210 sends a signal to all of the ionizers to produce more positive ions. Controller 210 may control each of the ionizers in ionizer system 10 separately. For example, if controller 210 receives a signal from sensor 50 that machine 2 needs more positive ions, controller 210 sends a signal to only the individual ionizer 30, and not to whole room ionizer 20, to produce more positive ions.

Sensor port 220 is arranged to physically connect one or more sensors to controller 210. For example, sensor 50 is connected to controller 210 via sensor port 220. It should be appreciated that controller 210 may have one or more sensor ports, and that the embodiment shown is not limited to only one sensor port. In an example embodiment, controller 210 comprises a separate sensor port for each sensor in ionizer system 10. Controller 210 may receive information from all of the sensors in ionizer system 10 together. For example, if controller 210 receives a signal from one sensor that ionizer system 10 needs more positive ions, controller 210 sends a signal to all of the ionizers to produce more positive ions. Controller 210 may receive information from each of the sensors in ionizer system 10 individually and locationally. For example, if controller 210 receives a signal from sensor 50 that machine 2 needs more positive ions, controller 210 sends a signal to only the individual ionizer 30, and not to whole room ionizer 20, to produce more positive ions. In an example embodiment, sensor port 220 comprises a built in boot loader for programming controller 210, specifically circuit board 214.

Antenna port 230 is arranged to physically connect controller 210 to a transmitter. Specifically, antenna port 230 is arranged to connect to a transmission device to transmit information wirelessly to receiver 42 of computing device 40. In an example embodiment, a transmission device may be built directly into controller 210 as will be discussed below. However, antenna port 230 allows for connection to a transmission device that is, for example, outside of the Faraday cage in which controller 210 is located. In an example embodiment, receiver 250 and transmitter 252 are both connected to antenna port 230, and antenna port is connected to a transmitter or an antenna, or a transmitter having an antenna, directly or via an extension cable.

Aggregator 238 comprises programming port 236, Universal Serial Bus (USB) ports 240, audio/composite video port 242, High-Definition Multimedia Interface (HDMI) port 244, and micro Universal Serial Bus (USB) port 246. Aggregator 238 is arranged a hardware device engineered to extract real-time intersection and traffic cabinet data from interconnected or non-interconnected intersections.

Controller 210 stores some data short-term (i.e., via aggregator 238) and feeds the information via a network protocol (e.g., Wi-Fi, Ethernet, or any other suitable means) to computing device 40, which handles long-term storage of the measurements. A user interface, initially a web browser in a computer, tablet, or mobile device, provides measurements, graphs, and alerts to the user. Cloud connectivity is also an option, enabling enterprise-wide monitoring. Connectivity to other process automation software and hardware will allow improved process control and product manufacturing monitoring, enabling traceability of a particular item back to each manufacturing step, and a log of how effective the anti-static measures were.

Controller 210 receives information from sensor 50, for example, that there is an imbalance in positive and negative ions. Controller 210 then sends a signal to whole room ionizer 20 and/or individual ionizer 30 to produce either positive or negative ions, whichever are needed. Sensor 50 then sends a signal to controller 210 when there is a balance in positive and negative ions. Controller 210 then sends a signal to whole room ionizer 20 and individual ionizer 30 to stop producing ions. Controller 210 sends information to computing device 40 which is arranged to log data. For example, data may collected regarding the length of time the ionizers run in order to balance the ions in the space or room. If the ionizers need to run for 45 minutes while producing negative ions, but only need to run for 10 minutes while producing positive ions, this may be an indication that the ionizers are not producing negative ions as efficiently as they should be. Additionally or alternatively, this may be an indication that something in the space or room (e.g., a machine) is causing the significant imbalance of positive ions to negative ions, which is resulting in the need for significantly more negative ions. The real-time monitoring and data logging capabilities of ionizer system 10, specifically through the use of sensor 50, allows the efficiencies of the ionizers to be determined quickly and effectively, and allows deficiencies in machines to be detected.

Figure 10:
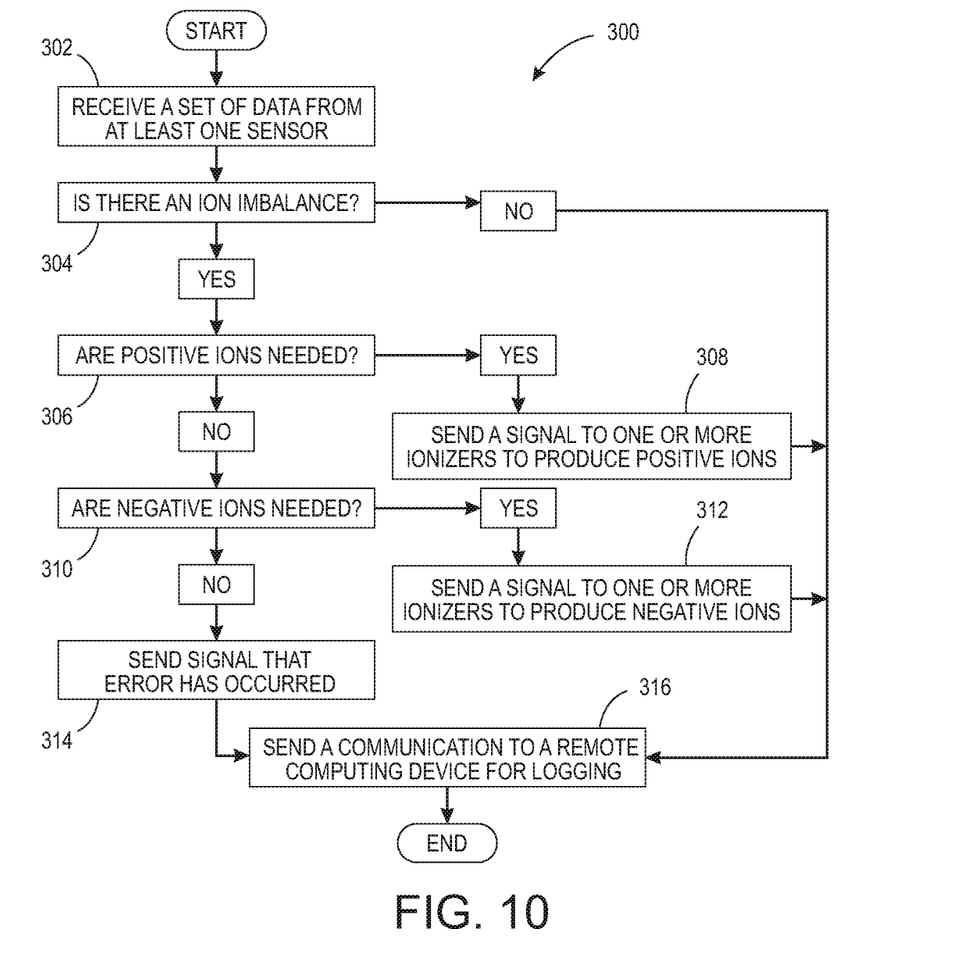
FIG. 10 is a flow chart of a method of controlling the ionizer system of FIG. 1.

FIG. 10 shows flow chart 300 outlining a method of controlling ionizer system 10. The method is performed by controller 110, which is in communication with whole room ionizer 20, individual ionizer 30, senor 50, and remote computing device 40.

In step 302, controller 50 receives a set of data from sensor 50. The data may be received via electrical conduit 12 (i.e., hardwired connection) or via a wireless transmission sent by transmitter 51 (i.e., wireless connection).

In step 304, controller 50 determines if there is an ion imbalance in the space or room. For example, if the level of positive ions is equal to the level of negative ions, then there is no ion imbalance. If the level of positive ions is not equal to the level of negative ions, then there is an ion imbalance.

If there is no ion imbalance, then in step 316, controller 50 sends a communication to remote computing device 40. Computing device 40 logs this communication (i.e., at that particular moment in time there was no ion imbalance). Additionally, if there is no ion imbalance, controller 50 may send a signal to whole room ionizer 20 and/or individual ionizer 30 to produce a balanced quantity of positive and negative ions.

If there is an ion imbalance, then in step 306, controller 50 determines if more positive ions are needed. If the level of positive ions is less than the level of negative ions, then more positive ions are needed. If the level of positive ions is greater than or equal to the level of negative ions, then more positive ions are not needed.

If more positive ions are needed, then in step 308, controller 50 sends a signal to whole room ionizer 20 and/or individual ionizer 30 to produce positive ions.

If more positive ions are not needed, then in step 310, controller 50 determines if more negative ions are needed. If the level of negative ions is less than the level of positive ions, then more negative ions are needed. If the level of negative ions is greater than or equal to the level of positive ions, then more negative ions are not needed. It should be appreciated that this step may be removed from the method because, if controller 50 determines that there is an ion imbalance in step 304, and also determines that more positive ions are not needed in step 306, then by logic more negative ions must be needed.

If more negative ions are needed, then in step 312, controller 50 sends a signal to whole room ionizer 20 and/or individual ionizer 30 to produce negative ions.

If more negative ions are not needed, then in step 314, controller 50 sends a signal that an error in ionizer system 10 has occurred. Controller 50 may, for example, send a signal to a remote location through event detector port 116 and/or indicate a system error via indicator lights 126/128.

After controller 50 has sent a signal either in step 308, step 312, or step 314, controller sends a communication to computing device 40. Computing device 40 logs the communication. The data that is logged by computing device 40 can then be analyzed and compiled to determine the efficiency of the ionizers, the calibration of the sensors, and any defects in the system producing an excessive charge in the space or room (e.g., a faulty machine).

It should be appreciated that there are various methods of increasing the level of positive ions relative to negative ions and also increasing the level of negative ions relative to positive ions. For example, if more negative ions are needed, controller 50 may stop the production of positive ions and continue to produce negative ions, reduce the production of positive ions and continue to produce negative ions, stop the production of positive ions and increase the production of negative ions, or reduce the production of positive ions and increase the production of negative ions. If more positive ions are needed, controller 50 may stop the production of negative ions and continue to produce positive ions, reduce the production of negative ions and continue to produce positive ions, stop the production of negative ions and increase the production of positive ions, or reduce the production of negative ions and increase the production of positive ions.

It will be appreciated that various aspects of the disclosure above and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

LIST OF REFERENCE NUMERALS

2 Machine
10 Ionizer system
12 Electrical conduit
20 Whole room ionizer
22 Receiver
30 Individual ionizer
32 Receiver
40 Computing device
42 Receiver
44 Transmitter
50 Sensor
51 Transmitter
52 Housing
54 End
56 End
58 Port
60 Circuit board
62 Control relay
63 Filter capacitor
64 Gain-control resistor
66 Circuit board
68 Power Inductor
70 Capacitor
72 Capacitor
73A Pin
73B Pin
74 Circuit board
75 Filter capacitor
76 Control relay
78 Gain-control resistor
80 Ion sensor
82 End
84 End
86 Cage
87 Openings
88 Core
90 Wire
92 Wire
94 Wire
96 Circuit board assembly
110 Controller
112 Housing
112A Bottom portion
112B Top portion (not shown)
114 Circuit board
116 Event detector port
118 Ionizer port
120 Sensor port
122 Optional port
124 Mode button
126 Indicator light
128 Indicator light
130 Antenna port
132 Power port
134 Optional communication port
136 Programming port
138 Data aggregator
140 Universal Serial Bus (USB) ports
142 Audio/composite video port
144 High-Definition Multimedia Interface (HDMI) port
146 Micro Universal Serial Bus (USB) port
210 Controller
212 Housing
212A Bottom portion
212B Top portion
214 Circuit board
216 Event detector port
218 Ionizer port
220 Sensor port
222 Optional port
224 Mode button
226 Indicator light
228 Indicator light
230 Antenna port
232 Power port
234 Optional communication port
236 Programming port
238 Data aggregator
240 Universal Serial Bus (USB) ports
242 Audio/composite video port
244 High-Definition Multimedia Interface (HDMI) port
246 Micro Universal Serial Bus (USB) port
250 Receiver
252 Transmitter
300 Flow chart
302 Step
304 Step
306 Step
308 Step
310 Step
312 Step
314 Step
316 Step

What is claimed is:

1. An ionizer system, comprising:
a controller, comprising:
an event detector port;
an ionizer port arranged to connect the at least one ionizer to the controller;
a sensor port arranged to connect the at least one sensor to the controller;
an antenna port arranged to connect the controller to a transmitter;
at least one indicator light;
at least one sensor connected to the controller, the at least one sensor including:

a first circuit board assembly;
a core;
a cage at least partially surrounding the core;
a first wire connected to the first circuit board assembly;
a second wire connected to the first circuit board assembly; and,
a third wire connecting the cage to the first circuit board assembly; and,
at least one ionizer connected to the controller.

2. The ionizer system as recited in claim 1, wherein the sensor further comprises a housing at least partially enclosing the first circuit board assembly, the housing including a first end and a second end.

3. The ionizer system as recited in claim 2, wherein the sensor further comprises a port connected to the first circuit board assembly, the port arranged proximate the first end.

4. The ionizer system as recited in claim 3, wherein the core and the cage extend from the second end.

5. The ionizer system as recited in claim 1, wherein the controller further comprises
a second circuit board assembly.

6. The ionizer system as recited in claim 5, wherein the controller further comprises
a power port.

7. The ionizer system as recited in claim 6, wherein the controller is operatively arranged to communicate with a remote computing device via the antenna port.

8. The ionizer system as recited in claim 5, wherein the controller further comprises a data aggregator.

9. The ionizer system as recited in claim 5, wherein the controller further comprises a transmitter and a receiver for wirelessly communicating with a remote computing device.

10. The ionizer system as recited in claim 1, wherein the at least one sensor and the at least one ionizer are connected to the controller wirelessly.

11. A method of monitoring an ionizing system, the method comprising:
receiving a first set of data from at least one sensor of an ion imbalance;
making a first determination, based on the first set of data, whether positive ions or negative ions are needed;
sending a first signal, based on the first determination, to at least one ionizer to produce the positive ions or negative ions;
sending a first communication about the first determination and the first signal to a remote computing device;
receiving a second set of data from the at least one sensor of an ion balance;
making a second determination, based on the second set of data, that no positive ions or negative ions are needed;
sending a second signal, based on the second determination, to the at least one ionizer to stop producing positive and negative ions; and,
sending a second communication about the second determination and the second signal to the remote computing device.

12. An ionizer system, comprising:
a controller, comprising:
a plurality of ports;
at least one indicator light; and,
a first circuit board assembly;
at least one sensor connected to the controller, the at least one sensor including:
a second circuit board assembly;
a core;
a cage at least partially surrounding the core;
a first wire extending into the core and connected to the second circuit board assembly;
a second wire extending into the core and connected to the second circuit board assembly; and,
a third wire connecting the cage to the second circuit board assembly; and,
at least one ionizer connected to the controller.

* * * * *